March 28, 1967 N. E. MAESTRE 3,311,751

CONTROL CIRCUIT FOR VOLTAGE CONTROLLED OSCILLATOR

Original Filed July 23, 1962

INVENTOR
NEIL E MAESTRE

BY Paris, Haskell & Levine
ATTORNEYS

United States Patent Office 3,311,751

Patented Mar. 28, 1967

3,311,751

CONTROL CIRCUIT FOR VOLTAGE CONTROLLED OSCILLATOR

Neil E. Maestre, Levittown, N.J., assignor, by mesne assignments, to United Aircraft Corporation, a corporation of Delaware Original application July 23, 1962, Ser. No. 211,537. Divided and this application Oct. 25, 1963, Ser. No. 318,892

3 Claims. (Cl. 307—88.5)

This application is a division of copending application Ser. No. 211,537, filed July 23, 1962, now Patent No. 3,204,195.

This invention generally relates to improvements in slaved variable frequency oscillators for use in data pulse telemetering systems among others, and more particularly is concerned with an improved slaved oscillator having a memory to maintain its frequency stability for relatively long time periods despite interruptions or temporary loss of its slaving or synchronizing signal.

In time multiplex data pulse telemetering systems it is often necessary to provide an oscillator system that is very accurately slaved or synchronized in frequency with a remote source of master oscillations. Quite often such slaved oscillators are provided in the form of a voltage controlled multivibrator which is synchronized in frequency with the remote source by means of a controlling voltage generated by the same pulses from the remote source that carry the data information.

During such telemetry operation, it oftentimes occurs that the transmissions of the data pulses are interrupted, sometimes only momentarily, whereby the voltage signal controlling the oscillator frequency is removed and the oscillator loses frequency synchronism with the master thereby resulting in errors in the decommutation of the telemetered data.

To overcome this source of error according to the present invention there is provided an improved slaved oscillator system wherein the oscillator is supplied with a continuously operating dynamic memory and therefore continues to oscillate at its preexisting frequency despite loss of its synchronizing signal. In this manner, when the data link is restored and the synchronizing voltage is reapplied to the oscillator, the oscillator is in synchronism or substantially so with the remote source and the errors in decommutation of the pulse data are accordingly minimized.

It is accordingly a principal object of the invention to provide an improved slaved oscillator capable of rapidly varying its frequency in response to changes in a master or control frequency yet maintaining its frequency stability for relatively long periods of time despite interruptions or loss of the master oscillation.

A further object is to provide a phase synchronized multivibrator having a memory to stabilize its frequency in the event of interruption or loss of the master frequency.

A still further object is to provide a variable frequency oscillator having automatic frequency stabilization at its different frequencies.

Still another object is to provide an improved feedback stabilized oscillator capable of being rapidly synchronized with variations of a master oscillation.

A still further object is to provide an improved false pulse generator for pulse data telemetry systems.

Another object is to provide an improved phase comparator.

Other objects and additional advantages will be more readily appreciated by those skilled in the art after a detailed consideration of the following specification taken with the accompanying drawing wherein:

FIG. 1 illustrates details of a preferred circuit for the 180° phase splitter and phase comparator and FIG. 2 is a waveform timing diagram for illustrating the operation of these circuits.

As shown the incoming master pulses are applied through a pulse amplifier-shaper 20 and thence directed to the base electrode of transistor 61. The transistor 61 is connected in series with resistors 62 and 63 whereby at the collector electrode thereof, the master pulses are inverted or delayed by 180° and at the emitter thereof the master pulses are reproduced in phase.

Figure 1:
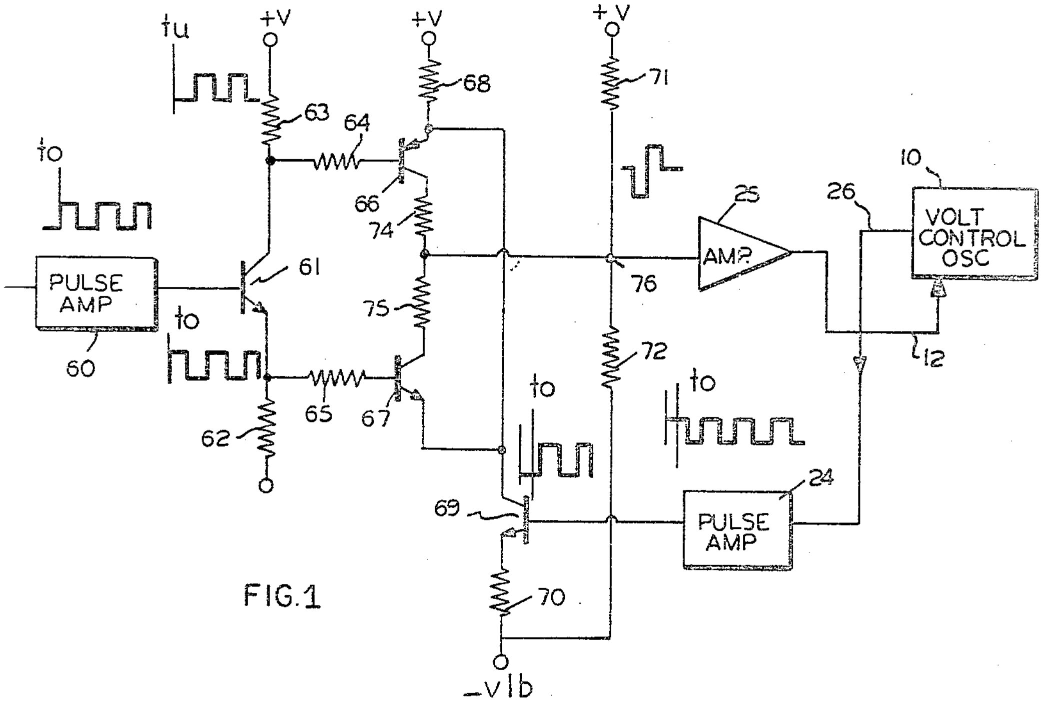
FIG. 1 is an electrical schematic illustration of a preferred phase splitter and comparator circuit.
Figure 2:
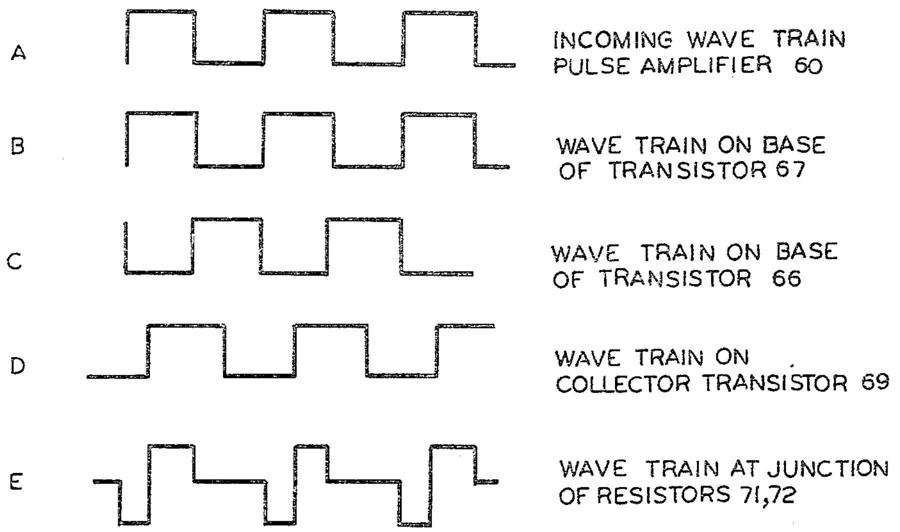
FIG. 2 is a timing diagram for illustrating the operation of the phase splitter and comparator circuit.

Referring to FIG. 2, the incoming shaped master pulses are illustrated by the uppermost waveform, labeled A, and the waveforms B and C illustrate the 180 degree phase displaced signals appearing at the emitter and collector respectively of transistor 61.

The inverted pulse train from the collector electrode is directed through a current limiting resistor 64 to the base of a PNP transistor 66 and the in phase pulse train is directed to the base electrode of an opposite NPN transistor 67 whereby both of the opposite type transistors 66 and 67 are energized in synchronism with the correct polarity pulses to turn on and off together.

The operation of this preferred phase comparison circuit is performed by the gating on and off of a transistor 69 in response to feedback pulses obtained from the multivibrator 10.

In operation, as the gating transistor 69 is rendered conducting, the drop in potential at its collector electrode biases the emitter of transistor 67 to a condition permitting conduction and biases the emitter of the opposite type transistor 66 to a nonconducting condition. Similarly as the gating transistor 69 is rendered nonconducting, the biasing is reversed with transistor 66 being conditioned for conduction and transistor 67 rendered nonconducting. Thus the gating transistor 69 selectively permits conduction through only one of the transistors 66 or 67 at a time and cuts off the other from conduction.

When transistor 66 conducts current, the current flow through resistors 68, 74, and 72 produces a positive voltage change across resistor 72 and when transistor 67 conducts current, the current flow through resistors 71 and 75 produces a negative voltage change across resistor 72.

Presupposing that the feedback pulses from the oscillator 10 and through the pulse amplifier 24 to the base electrode of gating transistor 69, occur in time equally between the 180° phase split master pulses; or in other words are phase displaced by about 90°, as shown in waveform D, then the conduction time of transistor 66 is about equal to that of transistor 67 and the waveform E produced at junction 76 is approximately symmetrical with equal positive and negative areas. As this waveform is average or integrated by amplifier 25, the error control voltage over line 12 is minimized. However, should the master pulses change in frequency, this phased relationship is changed and the error signal at junction 76 becomes predominantly more positive or negative thereby to increase the error voltage over line 12 to the multivibrator 10 and accordingly change the frequency thereof, as discussed above, to bring about a new synchronism of the oscillator with the master pulses.

Although but one preferred embodiment of the invention has been illustrated and described, it is believed that many changes may be made by those skilled in the art without departing from the spirit and scope of this invention. Accordingly, this invention is to be considered as being limited only by the following claims appended hereto.

What is claimed is:

1. A phase comparator circuit comprising:

a phase splitter circuit for producing two signals 180° out of phase, a pair of transistors of opposite conductivity types, each being energized by a different one of said phase displaced signals thereby to jointly conduct and being rendered nonconductive, a gating transistor interconnected to said pair of transistors to reversedly bias one of said transistors conducting and the other nonconducting, an output circuit selectively responsive to one of said transistors conducting to produce a positive wave and to the other of said transistors conducting to produce a negative wave, means for energizing said phase splitter by an input signal and means for controlling the conduction of said gate circuit by another input signal to be phase compared with the first input signal.

2. A phase comparator circuit comprising:

a pair of transistors having first, second, and third electrodes, a common output circuit interconnecting a first electrode of both transistors to develop a signal of one phase whenever one of said transistors is rendered conducting and of the opposite phase when the other transistor is rendered conducting, means for averaging the signals developed at the output to obtain an error signal, means for introducing a first input signal to energize a second electrode of both transistors in an out-of-phase relationship, a biasing means for energizing a third electrode of both transistors, said biasing means being energized by a second input signal to be phase compared with the first input signal, said biasing means being responsive to one polarity of the second input signal to render one of said pair of transistors conducting and responsive to the opposite polarity of the second input signal to render the other of said pair of transistors conducting, whereby the signal developed at the common output circuit is proportional to the phase relationship between said first and second input signals.

3. A phase comparator circuit comprising:

a pair of transistors of opposite conductivity type, each having a base, collector, and emitter electrode, means interconnecting the collector electrodes of both transistors to a common output circuit, a transistor switch means, means interconnecting the emitter electrodes of both transistors in common to said transistor switch means, first and second input signals to be phase compared, means for coupling said first input signal in phase opposition to the base electrodes of said pair of transistors, means coupling said second input signal to said transistor switch means, and means for averaging an output signal obtained at said common output circuit.

References Cited by the Examiner

UNITED STATES PATENTS

| | | | |
|---|---|---|---|
| 3,031,588 | 4/1962 | Hilsenrath | 307—88.5 |
| 3,059,187 | 10/1962 | Jaffe | 328—155 X |
| 3,184,680 | 5/1965 | Bull | 307—88.5 X |
| 3,195,068 | 7/1965 | DuVall | 307—88.5 X |
| 3,199,037 | 8/1965 | Graves | 328—155 |

ARTHUR GAUSS, *Primary Examiner.*

J. JORDAN, *Assistant Examiner.*